United States Patent
Ku et al.

(10) Patent No.: US 9,793,896 B1
(45) Date of Patent: Oct. 17, 2017

(54) SEMICONDUCTOR DEVICE

(71) Applicant: SK hynix Inc., Gyeonggi-do (KR)

(72) Inventors: Young-Jun Ku, Seoul (KR); Dae-Suk Kim, Gyeonggi-do (KR); Jang-Ryul Kim, Gyeonggi-do (KR); Jong-Chern Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/473,907

(22) Filed: Mar. 30, 2017

(30) Foreign Application Priority Data

Aug. 9, 2016 (KR) ........................ 10-2016-0101186

(51) Int. Cl.
| | |
|---|---|
| *H03K 19/00* | (2006.01) |
| *H03K 19/003* | (2006.01) |
| *G11C 29/00* | (2006.01) |
| *G11C 7/10* | (2006.01) |

(52) U.S. Cl.
CPC ......... *H03K 19/00392* (2013.01); *G11C 7/10* (2013.01); *G11C 29/76* (2013.01)

(58) Field of Classification Search
CPC ... H03K 19/003; H03K 19/00392; G11C 7/10
USPC .................... 326/9–10, 37–41, 47
See application file for complete search history.

(56) References Cited

U.S. PATENT DOCUMENTS

| | | | | |
|---|---|---|---|---|
| 6,107,820 | A * | 8/2000 | Jefferson | H03K 19/17728 326/10 |
| 6,201,404 | B1 * | 3/2001 | Reddy | H03K 19/17736 326/10 |
| 6,346,824 | B1 * | 2/2002 | New | G06F 7/5324 326/39 |
| 6,380,992 | B1 | 4/2002 | Lee | |
| 6,443,739 | B1 | 9/2002 | Currie | |
| 6,704,226 | B2 * | 3/2004 | Lee | G11C 29/785 365/200 |
| 7,215,140 | B1 * | 5/2007 | Saini | H03K 19/17732 326/12 |
| 8,860,460 | B1 * | 10/2014 | Cashman | H03K 19/17736 326/38 |
| 9,236,864 | B1 * | 1/2016 | Loh | H01L 23/538 |

(Continued)

OTHER PUBLICATIONS

Jun, H. et al., High-Bandwidth Memory (HBM) Test Challenges and Solutions, Nov. 2, 2016, pp. 16-25, IEEE.

*Primary Examiner* — Jason M Crawford
(74) *Attorney, Agent, or Firm* — IP & T Group LLP

(57) ABSTRACT

A semiconductor device includes: first to $N^{th}$ input terminals (where N is an integer equal to or greater than 2); and a redundant input terminal. When a $K^{th}$ input terminal (where K is an integer ranging from 1 to N−1) is defective among the first to $N^{th}$ input terminals, $(K+1)^{th}$ to $N^{th}$ input terminals receive signals of $K^{th}$ to $(N-1)^{th}$ input terminals, respectively, and the redundant input terminal receives a signal of the $N^{th}$ input terminal.

16 Claims, 6 Drawing Sheets

(56) References Cited

U.S. PATENT DOCUMENTS

| | | | |
|---|---|---|---|
| 2005/0264318 A1* | 12/2005 | Chan | H03K 19/17764 326/41 |
| 2008/0218197 A1* | 9/2008 | Lewis | H03K 19/00392 326/10 |
| 2009/0267643 A1* | 10/2009 | Lewis | G06F 7/506 326/38 |
| 2013/0009694 A1* | 1/2013 | Camarota | H01L 22/22 327/526 |

* cited by examiner

US 9,793,896 B1

SEMICONDUCTOR DEVICE

CROSS-REFERENCE TO RELATED APPLICATIONS

The present application claims priority of Korean Patent Application No. 10-2016-0101186, filed on Aug. 9, 2016, which is incorporated herein by reference in its entirety.

BACKGROUND

1. Field

Exemplary embodiments of the present invention relate to a semiconductor device, and more particularly, to a semiconductor device and a method thereof for repairing a defect of an input terminal of the semiconductor device.

2. Description of the Related Art

In the early days of the semiconductor memory device industry, there were many original good dies, i.e., memory chips that are produced on a wafer without any defective memory cell directly from a semiconductor fabrication process. Generally, as the capacity of a memory device is increased gradually, it becomes more difficult to fabricate memory devices that are completely free from any defective memory cells. Nowadays, the likelihood that a memory device is fabricated without any defective memory cell is rather very small. For this reason, existing semiconductor fabrication processes may typically employ a repairing method that replaces defective cells with redundant memory cells.

Also, as the bandwidth of semiconductor memory devices is increased, the number of input terminals of a semiconductor memory device is increased, too. For example, a typical High Bandwidth Memory (HBM) may use more than a thousand input terminals for achieving the required bandwidth. Hence, it has become increasingly more challenging to ensure that an HBM has no defective input terminals and developing a technology for repairing input terminal defects would be highly desirable.

SUMMARY

Embodiments of the present invention are directed to a semiconductor device capable of repairing a defective input terminal of the semiconductor device. Embodiments of the present invention are also directed to a method of repairing a defective input terminal of the semiconductor device.

In accordance with an embodiment of the present invention, a semiconductor device includes: first to $N^{th}$ input terminals (where N is an integer equal to or greater than 2); and a redundant input terminal, wherein when a $K^{th}$ input terminal (where K is an integer ranging from 1 to N−1) is defective among the first to $N^{th}$ input terminals, $(K+1)^{th}$ to $N^{th}$ input terminals receive signals of $K^{th}$ to $(N-1)^{th}$ input terminals, respectively, and the redundant input terminal receives a signal of the $N^{th}$ input terminal.

The semiconductor device may further include: first to $N^{th}$ buffers that are coupled to the first to $N^{th}$ input terminals, respectively; and a redundant buffer that is coupled to the redundant input terminal.

The semiconductor device may further include: first to $(N-1)^{th}$ selectors, each of the selectors suitable for selecting one signal between a signal inputted through a corresponding buffer among the first to $(N-1)^{th}$ buffers and a signal inputted through a buffer that comes next to the corresponding buffer; and an $N^{th}$ selector suitable to for selecting one signal between a signal inputted through the $N^{th}$ buffer and a signal inputted through the redundant buffer.

The semiconductor device may be a memory device; the first input terminal may be an input terminal for receiving a data mask signal; the second to $(N-1)^{th}$ input terminals may be input terminals for receiving a series of data; and the $N^{th}$ input terminal may be an input terminal for receiving a data bus inversion signal.

Each of the first to $N^{th}$ input terminals may include at least one selected from a group including a pad, a pin, and a micro bump.

In accordance with another embodiment of the present invention, a semiconductor device includes: first to $N^{th}$ input terminals (where N is an integer equal to or greater than 2); $(N+1)^{th}$ to $2N^{th}$ input terminals; and a redundant input terminal, wherein when a $K^{th}$ input terminal (where K is an integer ranging from 1 to N−1) is defective among the first to $N^{th}$ input terminals, $(K+1)^{th}$ to $N^{th}$ input terminals receive signals of $K^{th}$ to $(N-1)^{th}$ input terminals, respectively, and the redundant input terminal receives a signal of the $N^{th}$ input terminal, and when a $J^{th}$ input terminal (where J is an integer ranging from (N+1) to (2N−1)) is defective among the $(N+1)^{th}$ to $2N^{th}$ input terminals, $(J+1)^{th}$ to $2N^{th}$ input terminals receive signals of $J^{th}$ to $(2N-1)^{th}$ input terminals, respectively, and the redundant input terminal receives a signal of the $2N^{th}$ input terminal.

When there is a defective input terminal among the first to $N^{th}$ input terminals and there is a defective input terminal among the $(N+1)^{th}$ to $2N^{th}$ input terminals, the redundant input terminal may receive one between a signal of the $N^{th}$ input terminal and a signal of the $2N^{th}$ input terminal.

The semiconductor device may further include: first to $N^{th}$ buffers that are coupled to the first to $N^{th}$ input terminals, respectively; $(N+1)^{th}$ to $2N^{th}$ buffers that are coupled to the $(N+1)^{th}$ to $2N^{th}$ input terminals, respectively; and a redundant buffer that is coupled to the redundant input terminal.

The semiconductor device may further include: first to $(N-1)^{th}$ selectors, each of the selectors suitable for selecting one signal between a signal inputted through a corresponding buffer among the first to $(N-1)^{th}$ buffers and a signal inputted through a buffer that comes next to the corresponding buffer; an $N^{th}$ selector suitable for selecting one signal between a signal inputted through the $N^{th}$ buffer and a signal inputted through the redundant buffer; $(N+1)^{th}$ to $(2N-1)^{th}$ selectors, each of the selectors suitable for selecting one signal between a signal inputted through a corresponding buffer among the $(N+1)^{th}$ to $(2N-1)^{th}$ buffers and a signal inputted through a buffer that comes next to the corresponding buffer; and a $2N^{th}$ selector suitable for selecting one signal between a signal inputted through the $2N^{th}$ buffer and a signal inputted through the redundant buffer.

The semiconductor device may be a memory device; the first input terminal and the $(N+1)^{th}$ input terminal may be input terminals for receiving data mask signals; the second to $(N-1)^{th}$ input terminals and the $(N+2)^{th}$ to $(2N-1)^{th}$ input terminals may be input terminals for receiving a series of data; and the $N^{th}$ input terminal and the $2N^{th}$ input terminal may be input terminals for receiving data bus inversion signals.

Each of the first to $2N^{th}$ input terminals may include at least one selected from a group including a pad, a pin, and a micro bump.

In accordance with another embodiment of the present invention, a method for repairing an input terminal of a semiconductor device comprising first to $N^{th}$ input terminals (where N is an integer equal to or greater than 2) and a redundant input terminal, the method includes: when a $K^{th}$ input terminal (where K is an integer ranging from 1 to N−1) is defective among the first to $N^{th}$ input terminals, selecting $(K+1)^{th}$ to $N^{th}$ input terminals to receive signals of $K^{th}$ to $(N-1)^{th}$ input terminals, respectively, and the redundant input terminal receiving a signal of the $N^{th}$ input terminal.

The semiconductor memory device may further includes: first to $N^{th}$ buffers that are coupled to the first to $N^{th}$ input terminals, respectively; and a redundant buffer that is coupled to the redundant input terminal.

The semiconductor device may further includes: first to $(N-1)^{th}$ selectors, each of the selectors suitable for selecting one signal between a signal inputted through a corresponding buffer among the first to $(N-1)^{th}$ buffers and a signal inputted through a buffer that comes next to the corresponding buffer; and an $N^{th}$ selector suitable for selecting one signal between a signal inputted through the $N^{th}$ buffer and a signal inputted through the redundant buffer.

The semiconductor device may be a memory device; the first input terminal may be an input terminal for receiving a data mask signal; the second to $(N-1)^{th}$ input terminals may be input terminals for receiving a series of data; and the $N^{th}$ input terminal may be an input terminal for receiving a data bus inversion signal.

Each of the first to $N^{th}$ input terminals may include at least one among a pad, a pin, and a micro bump.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
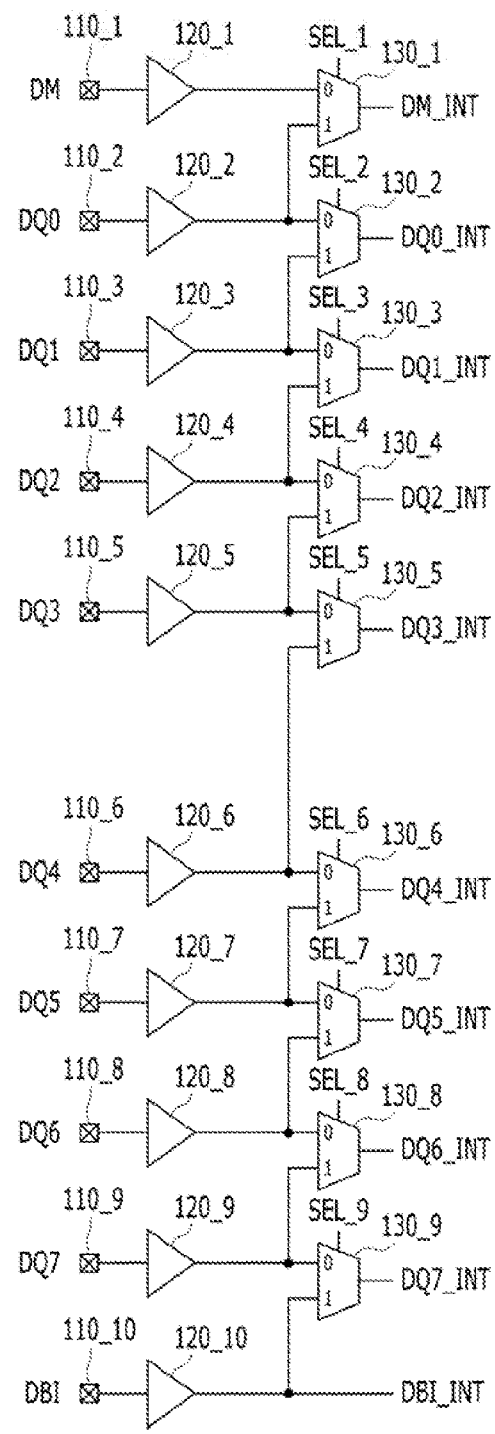
FIG. 1 is a diagram illustrating a semiconductor device, in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated to more clearly illustrate the various elements of the embodiments. For example, in the drawings, the size of elements and the intervals between elements may be exaggerated compared to actual sizes and intervals for convenience of Illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means any of the following, only A, only B, only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure.

It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present invention. The present invention may be practiced without some of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a diagram illustrating a semiconductor device in accordance with an embodiment of the present invention.

Referring to FIG. 1, the semiconductor device may include a plurality of input terminals, a plurality of buffers, and a plurality of selectors. For example, the semiconductor device may include first to $10^{th}$ input terminals 110_1 to 110_10, first to $10^{th}$ buffers 120_1 to 120_10, and first to 9th selectors 130_1 to 130_9.

The first to $10^{th}$ input terminals 110_1 to 110_10 may receive external signals DM, DQ0 to DQ7 and DBI that are received from the outside of the semiconductor device. Each of the first to $10^{th}$ input terminals 110_1 to 110_10 may be or include one among a pad, a pin, and a micro bump to receive the external signals DM, DQ0 to DQ7 and DBI. The shape of the pad, the pin, and the micro bump may be different according to the package type of the semiconductor device. FIG. 1 represents an example where the semiconductor device is a memory device, and a data mask signal DM, data DQ0 to DQ7, and a data bus inversion signal DBI are inputted to the first to $10^{th}$ input terminals 110_1 to 110_10. Herein, the data mask signal DM may be a signal representing whether the data DQ0 to DQ7 are masked or not, and the data bus inversion signal DBI may be a signal representing whether the data DQ0 to DQ7 are inverted or not.

The first to $10^{th}$ buffers 120_1 to 120_10 may be coupled to the first to $10^{th}$ input terminals 110_1 to 110_10, respectively, and receive the signals DM, DQ0 to DQ7 and DBI that are applied to the first to $10^{th}$ input terminals 110_1 to 110_10.

Each of the first to $9^{th}$ selectors 130_1 to 130_9 may select one signal between a signal inputted through a buffer that corresponds to the selector among the first to $9^{th}$ buffers 120_1 to 120_9 and a signal inputted through a buffer that comes next to the buffer corresponding to the selector. The selected signals may be outputted as internal signals DM_INT, DQ0_INT to DQ7_INT. The first to $9^{th}$ selectors 130_1 to 130_9 may perform the selection in response to first to $9^{th}$ selection signals SEL_1 to SEL_9, respectively. For example, when the third selection signal SEL_3 is '0', the third selector 130_3 may select a signal inputted through the third buffer 120_3 and output the signal of the third buffer 120_3 as an internal data signal DQ1_INT. When the third selection signal SEL_3 is '1', the third selector 130_3 may select a signal inputted through the fourth buffer 120_4 and output the signal of the fourth buffer 120_4 as an internal data signal DQ1_INT.

The selection signals for a selector among the selectors SEL_1 to Sel_9 corresponding to an input terminal among the first to $9^{th}$ input terminals 110_1 to 110_9, having an index number equal to or greater than the index number of a defective input terminal may have a level of '1', whereas the remaining selection signals may have a level of '0'. For example, when the fourth input terminal 110_4 is defective, the fourth to the ninth selection signals SEL_4 to SEL_9 may have a level of '1', and the remaining selection signals, i.e., the first to third selection signals SEL_1 to SEL_3, may have a level of '0'. When there is no defective input terminal among the first to $9^{th}$ input terminals 110_1 to 110_9, all the first to 9th selection signals SEL_1 to SEL_9 may have a level of '0'.

The levels of the first to $9^{th}$ selection signals SEL_1 to SEL_9 may be all decided during a test of a semiconductor device and stored in a non-volatile storage element, such as a fuse circuit and an e-fuse circuit in the inside of the semiconductor device. Also, the levels of the first to $9^{th}$ selection signals SEL_1 to SEL_9 may be decided through a setup operation during the initial operation of the semiconductor device.

Figure 2:
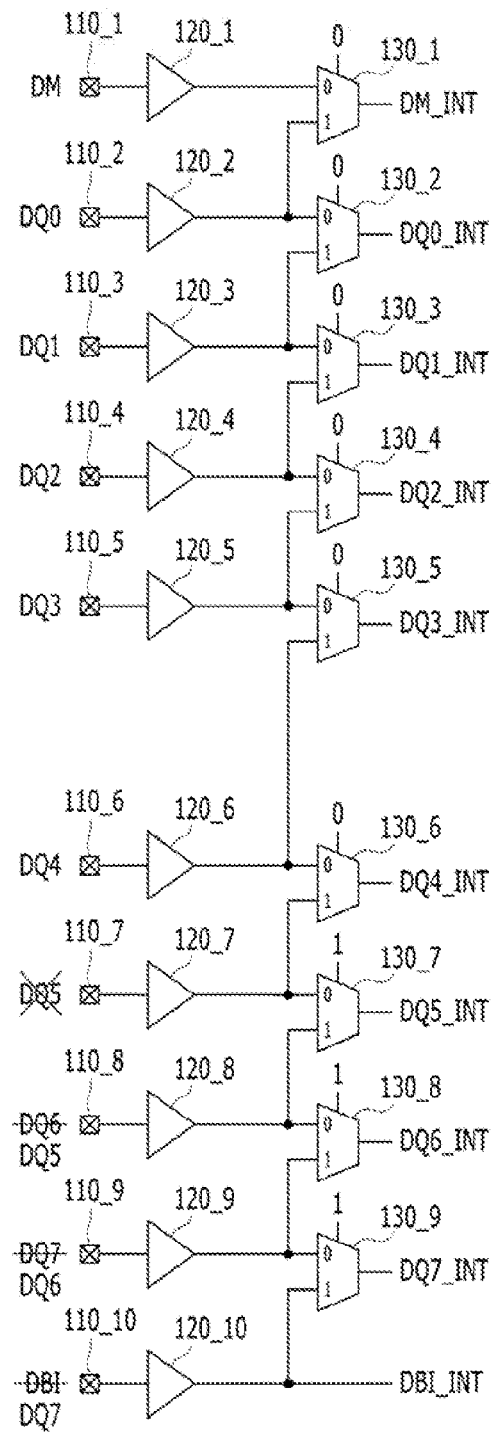
FIG. 2 is a diagram illustrating a repair operation of the semiconductor device shown in FIG. 1.

FIG. 2 is a diagram illustrating a repair operation of the semiconductor device shown in FIG. 1. It is assumed in FIG. 2 that the seventh input terminal 110_7 is defective.

When the seventh input terminal 110_7 is defective, the seventh to $9^{th}$ selection signals SEL_7 to SEL_9 may have a level of '1', and the first to sixth selection signals SEL_1 to SEL_6 may have a level of '0'.

An external device that applies the signals DM, DQ0 to DQ7 and DBI to the semiconductor device, such as a memory controller, may apply the signals DM and DQ0 to DQ4 to the input terminals whose number is lower than the defective seventh input terminal 110_7, which include the first to sixth input terminals 110_1 to 110_6. Further, the external device may not apply any input signal to the defective seventh input terminal 110_7, and may apply the signals DQ5 to DQ7 of the preceding numbers to the input terminals whose number is higher than the defective seventh input terminal 110_7, which include the eighth to $10^{th}$ input terminals 110_8 to 110_10.

Since the first to sixth selection signals SEL_1 to SEL_6 have a level of '0', the first to sixth selectors 130_1 to 130_6 may select the input signals DM and DQ0 to DQ4 that are inputted through the first to sixth buffers 120_1 to 120_6 and output the internal input signals DM_INT and DQ0_INT to DQ4_INT. Also, since the seventh to ninth selection signals SEL_7 to SEL_9 have a level of '1', the seventh to ninth selectors 130_7 to 130_9 may select the input signals DQ5 to DQ7 that are inputted through the eighth to $10^{th}$ buffers 120_8 to 120_10 and output the internal input signals DQ5_INT to DQ7_INT.

In FIG. 2, it may be seen that although the seventh input terminal 110_7 is defective, the input signals DM and DQ0 to DQ7 are inputted normally. However, a data signal is inputted in the DQ7 input terminal and since there is no input terminal to receive the data bus inversion signal DBI, the function of data bus inversion may not be used. When the function of data bus inversion is not used, it is still possible to perform an operation in the memory device but the current consumption and noise of the memory device may be increased.

Figure 3:
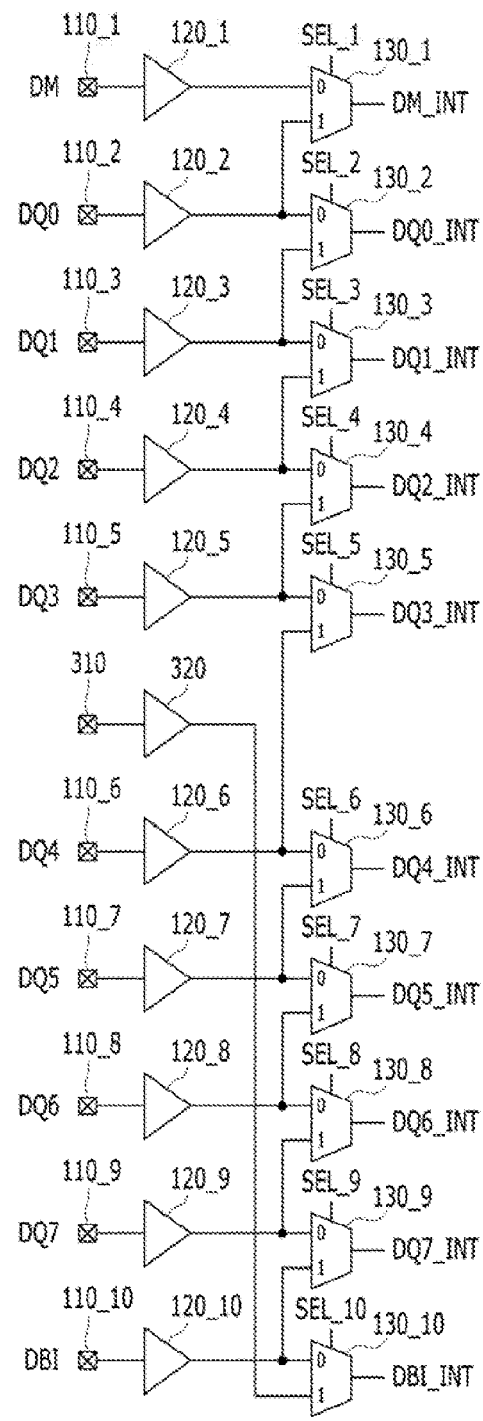
FIG. 3 is a diagram illustrating a semiconductor device, in accordance with another embodiment of the present invention.

FIG. 3 is a diagram Illustrating a semiconductor device in accordance with another embodiment of the present invention.

Referring to FIG. 3, the semiconductor device may include a plurality of input terminals, a plurality of buffers, and a plurality of selectors. For example, the semiconductor device may include first to $10^{th}$ input terminals 110_1 to 110_10, first to $10^{th}$ buffers 120_1 to 120_10, and first to $9^{th}$ selectors 130_1 to 130_9. The semiconductor device may further include a redundant input terminal 310, a redundant buffer 320, and a $10^{th}$ selector 130_10.

The redundant input terminal 310 may receive a signal of the $10^{th}$ input terminal 110_10 instead of the $10^{th}$ input terminal 110_10, when there is a defective input terminal among the first to $10^{th}$ input terminals 110_1 to 110_10.

The redundant buffer 320 may be coupled to the redundant input terminal 310 and receive an input signal that is inputted through the redundant input terminal 310.

The 10$^{th}$ selector 130_10 may select one between a signal inputted through the 10$^{th}$ buffer 120_10 and a signal inputted through the redundant buffer 320 in response to a 10$^{th}$ selection signal SEL_10, and output the selected signal as an internal signal DBI_INT. When there is one defective input terminal among the first to 10$^{th}$ input terminals 110_1 to 110_10, the 10$^{th}$ selection signal SEL_10 may have a level of '1'. When there is no defective input terminal among the first to 10$^{th}$ Input terminals 110_1 to 110_10, the 10$^{th}$ selection signal SEL_10 may have a level of '0'.

Figure 4:
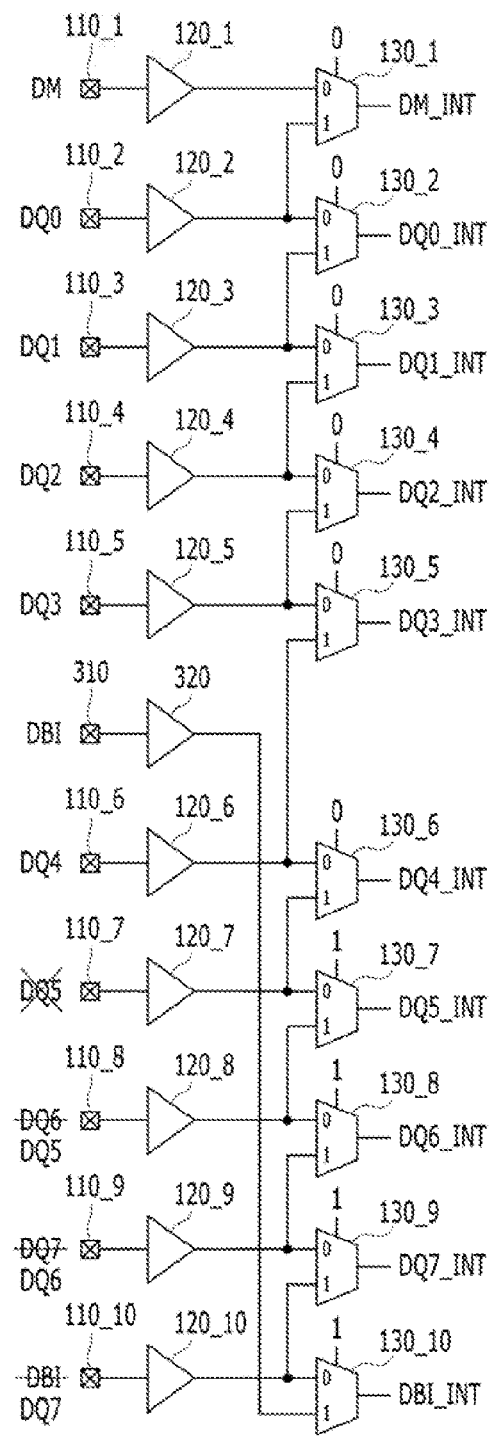
FIG. 4 is a diagram illustrating a repair operation of the semiconductor device shown in FIG. 3.

FIG. 4 is a diagram illustrating a repair operation of the semiconductor device shown in FIG. 3. Just as in FIG. 2, it is assumed in FIG. 4 that the seventh input terminal 110_7 is defective.

Referring to FIG. 4, the input signal DBI of the 10$^{th}$ input terminal 110_10 is inputted to the redundant input terminal 310 instead of the 10$^{th}$ input terminal 110_10. The 10$^{th}$ selector 130_10 may output the inputted signal through the redundant buffer 320 as an internal signal DBI_INT. Through this operation, it is possible to receive the data bus inversion signal DBI, although there is a defective input terminal among the first to 10$^{th}$ input terminals 110_1 to 110_10.

Figure 5:
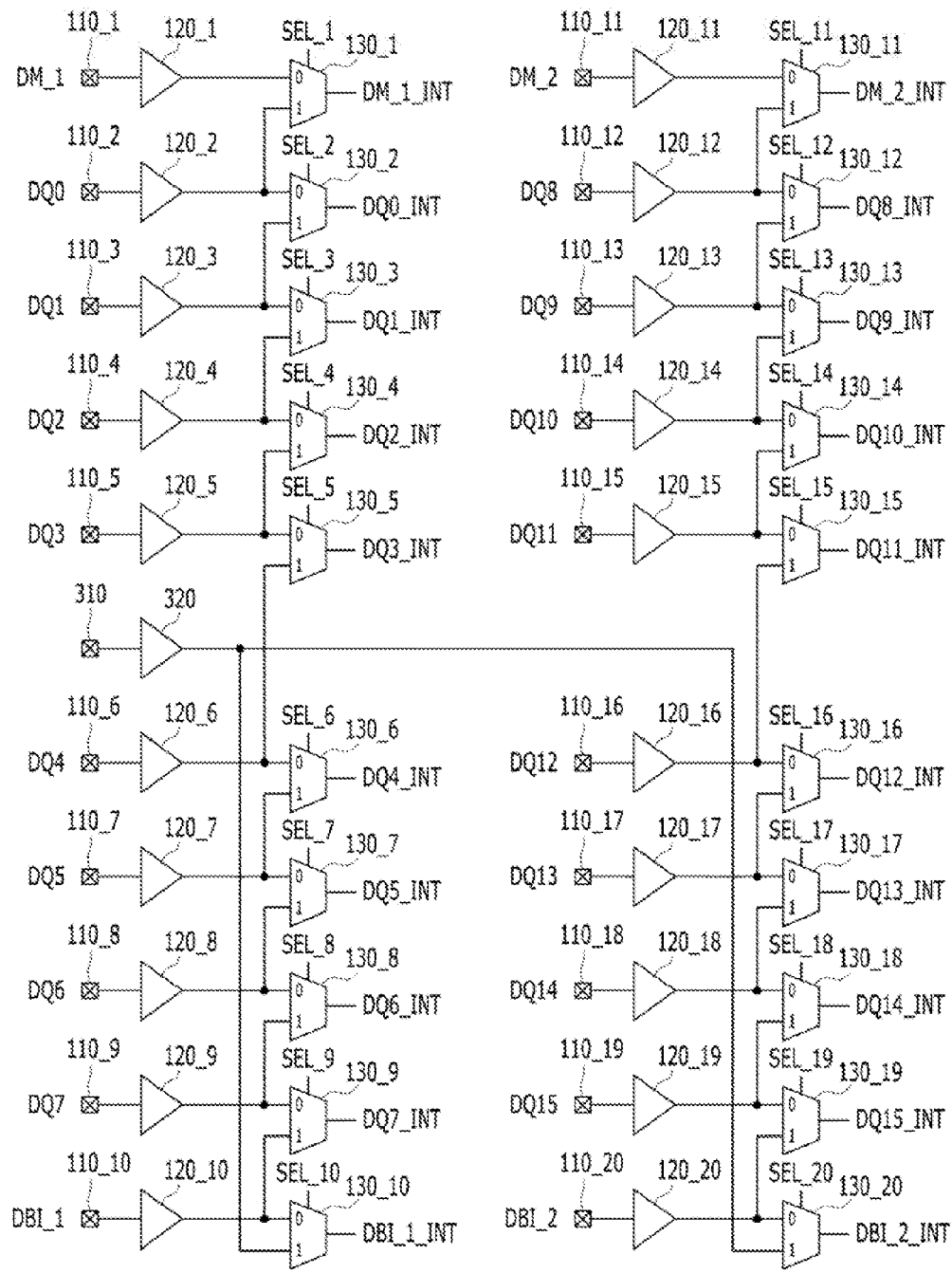
FIG. 5 is a diagram illustrating a semiconductor device, in accordance with yet another embodiment of the present invention.

FIG. 5 is a diagram Illustrating a semiconductor device in accordance with yet another embodiment of the present invention.

Referring to FIG. 5, the semiconductor device may include a plurality of input terminals, a plurality of buffers, and a plurality of selectors. For example, the semiconductor device may include first to 10$^{th}$ input terminals 110_1 to 110_10, first to 10$^{th}$ buffers 120_1 to 120_10, first to 10$^{th}$ selectors 130_1 to 130_10, 11$^{th}$ to 20$^{th}$ input terminals 110_11 to 110_20, 11$^{th}$ to 20$^{th}$ buffers 120_11 to 120_20, 11$^{th}$ to 20$^{th}$ selectors 130_11 to 130_20, a redundant input terminal 310, and a redundant buffer 320.

Compared with the semiconductor device shown in FIG. 3, the semiconductor device of FIG. 5 may further include the 11$^{th}$ to 20$^{th}$ input terminals 110_11 to 110_20, the 11$^{th}$ to 20$^{th}$ buffers 120_11 to 120_20, and the 11$^{th}$ to 20$^{th}$ selectors 130_11 to 130_20. The 11$^{th}$ to 20$^{th}$ input terminals 110_11 to 110_20, the 11$^{th}$ to 20$^{th}$ buffers 120_11 to 120_20, and the 11$^{th}$ to 20$^{th}$ selectors 130_11 to 130_20 may share the redundant input terminal 310 and the redundant buffer 320 with the first to 10$^{th}$ input terminals 110_1 to 110_10, the first to 10$^{th}$ buffers 120_1 to 120_10, and the first to 10$^{th}$ selectors 130_1 to 130_10.

When there is a defective input terminal among the first to 10$^{th}$ input terminals 110_1 to 110_10, selection signals whose number is equal to or greater than the number of the defective input terminal among first to 10$^{th}$ selection signals SEL_1 to SEL_10 may have a level of '1'. For example, when the third input terminal 110_3 is defective, the third to 10$^{th}$ selection signals SEL_3 to SEL_10 may have the level of '1', and the first and second selection signals SEL_1 and SEL_2 may have a level of '0'.

When there is a defective input terminal among the 11$^{th}$ to 20$^{th}$ input terminals 110_11 to 110_20, selection signals whose number is equal to or greater than the number of the defective input terminal among 11$^{th}$ to 20$^{th}$ selection signals SEL_11 to SEL_20 may have a level of '1'. For example, when the 18$^{th}$ input terminal 110_18 is defective, the 18$^{th}$ to 20$^{th}$ selection signals SEL_18 to SEL_20 may have the level of '1', and the 11$^{th}$ to 17$^{th}$ selection signals SEL_11 to SEL_17 may have a level of '0'.

When both of the 10$^{th}$ selection signal SEL_10 and the 20$^{th}$ selection signal SEL_20 have a level of '1', a collision that an input signal inputted to the redundant buffer 320 is transferred as two internal input signals DBI_1_INT and DBI_2_INT may occur. Therefore, when one input terminal among the first to 10$^{th}$ input terminals 110_1 to 110_10 is defective and one input terminal among the 11$^{th}$ to 20$^{th}$ input terminals 110_11 to 110_20 is defective, only one selection signal between the 10$^{th}$ selection signal SEL_10 and the 20$^{th}$ selection signal SEL_20 may have the level of '1'.

According to the embodiment of FIG. 5, it is possible to cope with a plurality of defective input terminals without increasing the number of the redundant input terminal 310 and the number of the redundant buffer 320. When one input terminal among the first to 10$^{th}$ input terminals 110_1 to 110_10 is defective and one input terminal among the 11$^{th}$ to 20$^{th}$ input terminals 110_11 to 110_20 is defective, one input signal between an input signal DBI_1 and an input signal DBI_2, which are otherwise supposed to be inputted to the 10$^{th}$ input terminal 110_10 and the 20$^{th}$ input terminal 110_20, has to be given up. However, such case does not occur often.

Figure 6:
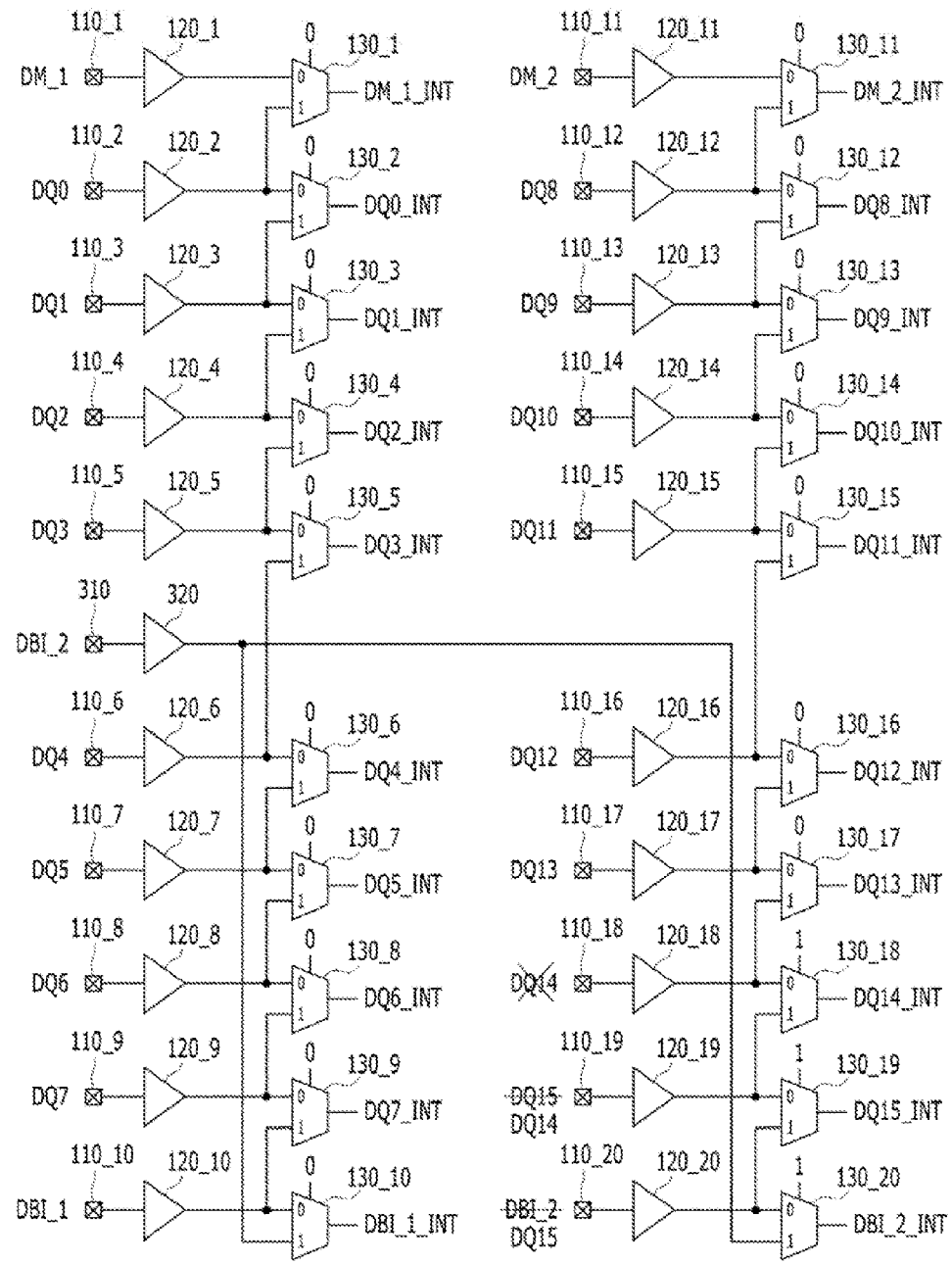
FIG. 6 is a diagram illustrating a repair operation of the semiconductor device shown in FIG. 5.

FIG. 6 is a diagram illustrating a repair operation of the semiconductor device shown in FIG. 5. It is assumed in FIG. 6 that the 18$^{th}$ input terminal 110_18 is defective.

Referring to FIG. 6, the first to 10$^{th}$ selection signals SEL_1 to SEL_10 and the 11$^{th}$ to 17$^{th}$ selection signals SEL_11 to SEL_17 may have a level of '0' and the 18$^{th}$ to 20$^{th}$ selection signals SEL_18 to SEL_20 may have a level of '1'.

Input signals DM_1, DQ0 to DQ7 and DBI_1 may be transferred as internal input signals DM_1_INT, DQ0_INT to DQ7_INT and DBI_1_INT through the first to 10$^{th}$ input terminals 110_1 to 110_10, the first to 10$^{th}$ buffers 120_1 to 120_10, and the first to 10$^{th}$ selectors 130_1 to 130_10.

Input signals DM_2 and DQ8 to DQ13 may be transferred as internal input signals DM_2_INT and DQ8_INT to DQ13_INT through the 11$^{th}$ to 17$^{th}$ input terminals 110_11 to 110_17, the 11$^{th}$ to 17$^{th}$ buffers 120_11 to 120_17, and the 11$^{th}$ to 17$^{th}$ selectors 130_11 to 130_17.

Input signals DQ14, DQ15 and DBI_2 may be inputted through the 19$^{th}$ and 20$^{th}$ input terminals 110_19 and 110_20 and the redundant input terminal 310, and transferred as internal input signals DQ14_INT, DQ15_INT and DBI_2_INT through the 19$^{th}$ and 20$^{th}$ buffers 120_19 and 120_20, the redundant buffer 320, and the 18$^{th}$ to 20$^{th}$ selectors 130_18 to 130_20.

According to the embodiments of the present invention, defective input terminals may be repaired in a semiconductor device.

While the present invention has been described with respect to the specific embodiments, it will be apparent to those skilled in the art that various changes and modifications may be made without departing from the spirit and scope of the invention as defined in the following claims.

What is claimed is:
1. A semiconductor device, comprising:
first to N$^{th}$ input terminals (where N is an integer equal to or greater than 2); and
a redundant input terminal,
wherein when a K$^{th}$ input terminal (where K is an integer ranging from 1 to N−1) is defective among the first to N$^{th}$ input terminals, (K+1)$^{th}$ to N$^{th}$ input terminals receive signals of K$^{th}$ to (N−1)$^{th}$ input terminals, respectively, and the redundant input terminal receives a signal of the N$^{th}$ input terminal.

2. The semiconductor device of claim 1, further comprising:
first to $N^{th}$ buffers that are coupled to the first to $N^{th}$ input terminals, respectively; and
a redundant buffer that is coupled to the redundant input terminal.

3. The semiconductor device of claim 2, further comprising:
first to $(N-1)^{th}$ selectors, each of the selectors suitable for selecting one signal between a signal inputted through a corresponding buffer among the first to $(N-1)^{th}$ buffers and a signal inputted through a buffer that comes next to the corresponding buffer; and
an $N^{th}$ selector suitable for selecting one signal between a signal inputted through the $N^{th}$ buffer and a signal inputted through the redundant buffer.

4. The semiconductor device of claim 1, wherein
the semiconductor device is a memory device;
the first input terminal is an input terminal for receiving a data mask signal;
the second to $(N-1)^{th}$ input terminals are input terminals for receiving a series of data; and
the $N^{th}$ input terminal is an input terminal for receiving a data bus inversion signal.

5. The semiconductor device of claim 1, wherein each of the first to $N^{th}$ input terminals includes at least one among a pad, a pin, and a micro bump.

6. A semiconductor device, comprising:
first to $N^{th}$ input terminals (where N is an integer equal to or greater than 2);
$(N+1)^{th}$ to $2N^{th}$ input terminals; and
a redundant input terminal,
wherein when a $K^{th}$ input terminal (where K is an integer ranging from 1 to N-1) is defective among the first to $N^{th}$ input terminals, $(K+1)^{th}$ to $N^{th}$ input terminals receive signals of $K^{th}$ to $(N-1)^{th}$ input terminals, respectively, and the redundant input terminal receives a signal of the $N^{th}$ input terminal, and
when a $J^{th}$ input terminal (where J is an integer ranging from (N+1) to (2N-1)) is defective among the $(N+1)^{th}$ to $2N^{th}$ input terminals, $(J+1)^{th}$ to $2N^{th}$ input terminals receive signals of $J^{th}$ to $(2N-1)^{th}$ input terminals, respectively, and the redundant input terminal receives a signal of the $2N^{th}$ input terminal.

7. The semiconductor device of claim 6, wherein
when there is a defective input terminal among the first to $N^{th}$ Input terminals and there is a defective input terminal among the $(N+1)^{th}$ to $2N^{th}$ input terminals, the redundant input terminal receives one between a signal of the $N^{th}$ input terminal and a signal of the $2N^{th}$ input terminal.

8. The semiconductor device of claim 6, further comprising:
first to $N^{th}$ buffers that are coupled to the first to $N^{th}$ input terminals, respectively;
$(N+1)^{th}$ to $2N^{th}$ buffers that are coupled to the $(N+1)^{th}$ to $2N^{th}$ input terminals, respectively; and
a redundant buffer that is coupled to the redundant input terminal.

9. The semiconductor device of claim 8, further comprising:
first to $(N-1)^{th}$ selectors, each of the selectors suitable for selecting one signal between a signal inputted through a corresponding buffer among the first to $(N-1)^{th}$ buffers and a signal inputted through a buffer that comes next to the corresponding buffer;
an $N^{th}$ selector suitable for selecting one signal between a signal inputted through the $N^{th}$ buffer and a signal inputted through the redundant buffer;
$(N+1)^{th}$ to $(2N-1)^{th}$ selectors, each of the selectors suitable for selecting one signal between a signal inputted through a corresponding buffer among the $(N+1)^{th}$ to $(2N-1)^{th}$ buffers and a signal inputted through a buffer that comes next to the corresponding buffer; and
a $2N^{th}$ selector suitable for selecting one signal between a signal inputted through the $2N^{th}$ buffer and a signal inputted through the redundant buffer.

10. The semiconductor device of claim 6, wherein
the semiconductor device is a memory device;
the first input terminal and the $(N+1)^{th}$ input terminal are input terminals for receiving data mask signals;
the second to $(N-1)^{th}$ input terminals and the $(N+2)^{th}$ to $(2N-1)^{th}$ input terminals are input terminals for receiving a series of data; and
the $N^{th}$ input terminal and the $2N^{th}$ input terminal are input terminals for receiving data bus inversion signals.

11. The semiconductor device of claim 6, wherein each of the first to $2N^{th}$ input terminals includes at least one among a pad, a pin, and a micro bump.

12. A method for repairing an input terminal of a semiconductor device comprising first to $N^{th}$ input terminals (where N is an integer equal to or greater than 2) and a redundant input terminal, the method comprising,
when a $K^{th}$ input terminal (where K is an integer ranging from 1 to N-1) is defective among the first to $N^{th}$ input terminals, selecting $(K+1)^{th}$ to $N^{th}$ input terminals to receive signals of $K^{th}$ to $(N-1)^{th}$ input terminals, respectively, and the redundant input terminal receiving a signal of the $N^{th}$ input terminal.

13. The method of claim 12, wherein the semiconductor memory device further comprises:
first to $N^{th}$ buffers that are coupled to the first to $N^{th}$ input terminals, respectively; and
a redundant buffer that is coupled to the redundant input terminal.

14. The method of claim 13, wherein the semiconductor device further comprises:
first to $(N-1)^{th}$ selectors, each of the selectors suitable for selecting one signal between a signal inputted through a corresponding buffer among the first to $(N-1)^{th}$ buffers and a signal inputted through a buffer that comes next to the corresponding buffer; and
an $N^{th}$ selector suitable for selecting one signal between a signal inputted through the $N^{th}$ buffer and a signal inputted through the redundant buffer.

15. The method of claim 12, wherein
the semiconductor device is a memory device;
the first input terminal is an input terminal for receiving a data mask signal;
the second to $(N-1)^{th}$ input terminals are input terminals for receiving a series of data; and
the $N^{th}$ input terminal is an input terminal for receiving a data bus inversion signal.

16. The method of claim 12, wherein each of the first to $N^{th}$ input terminals includes at least one among a pad, a pin, and a micro bump.

* * * * *